(12) United States Patent
Kubota

(10) Patent No.: US 6,323,530 B1
(45) Date of Patent: Nov. 27, 2001

(54) OPTICAL SEMICONDUCTOR DEVICE

(75) Inventor: Munechika Kubota, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/615,597

(22) Filed: Jul. 13, 2000

(30) Foreign Application Priority Data

Jul. 13, 1999 (JP) .................................................. 11-199322

(51) Int. Cl.$^7$ .................................................. H01L 31/00
(52) U.S. Cl. ........................... 257/466; 257/496; 257/635
(58) Field of Search .................................. 438/424, 692, 438/699, 734, 691, 129, 995, 227; 257/466, 496, 635, 750, 752, 324

(56) References Cited

U.S. PATENT DOCUMENTS

| | | | |
|---|---|---|---|
| 5,221,984 | * | 6/1993 | Furuyama et al. .................... 359/154 |
| 5,264,387 | * | 11/1993 | Beyer et al. ............................ 437/62 |
| 5,885,856 | * | 3/1999 | Gilbert et al. ........................ 438/129 |
| 6,072,225 | * | 6/2000 | Chang et al. ......................... 257/466 |
| 6,103,592 | * | 8/2000 | Levy et al. ............................ 438/424 |

FOREIGN PATENT DOCUMENTS

| | | | | |
|---|---|---|---|---|
| 03095935 | * | 4/1991 | (JP) ........................................ 21/221 |
| 2001024280 | * | 1/2001 | (JP) ......................................... 5/227 |

* cited by examiner

*Primary Examiner*—Charles Bowers
*Assistant Examiner*—Laura M Schillinger
(74) *Attorney, Agent, or Firm*—Wenderoth, Lind & Ponack, L.L.P.

(57) ABSTRACT

An optical semiconductor device includes a semiconductor substrate having an active layer, a semiconductor mesa stripe formed on the semiconductor substrate, a dummy mesa stripe formed on the semiconductor substrate, an insulating layer formed to fill up a gap between the semiconductor mesa stripe and the dummy mesa stripe, a main electrode formed on the semiconductor mesa stripe, and an extension electrode formed on top surfaces of the insulating layer and the dummy mesa stripe. The extension electrode is connected to the main electrode.

9 Claims, 2 Drawing Sheets

OPTICAL SEMICONDUCTOR DEVICE

BACKGROUND OF THE INVENTION

This invention relates to an optical semiconductor device. Property of the optical semiconductor device is influenced by temperature. Therefore, improvement for decreasing thermal affect is required.

Conventionally, face-down mounting is one of the methods for mounting an optical semiconductor device. A surface electrode of the optical semiconductor device is turned face down, and the device is mounted onto a basement such as a heat sink.

According to the face-down mounting, comparing with face-up mounting where the surface electrode is turned face up, distance between an active layer of the optical semiconductor device and a heat sink is short. Therefore, heat of the active layer of the device is diffused easily to the heat sink, and, it is possible to improve properties of the optical semiconductor device such as characteristic temperature or maximum output property.

In mounting the optical semiconductor device such as a laser diode, electrode layer is formed on the laser diode by vacuum evaporation, and solder layer is formed on the heat sink. Then, the electrode layer of the laser diode is contacted to the solder. Melting the solder, the laser diode is stuck on the heat sink.

In a kind of optical semiconductor device, one pair of facets of the active layer are covered with insulating layer such as reflecting film or non-reflecting film, therefore those facets are protected electrically, but other pair of facets are exposed. When such kind of device is mounted on the heat sink by the face-down mounting, solder reaches the exposed facets of the active layer. It occurs an electrical short of the device.

On the other hand, to restrict spread of an electric current or an electric field, a narrow semiconductor mesa stripe is formed on the active layer. When an optical semiconductor device with the mesa stripe is mounted onto a mount base by face-down mounting, connection between the device and the mount base is not sure. Therefore, it is difficult to consistently manufacture the device with same properties.

SUMMARY OF THE INVENTION

It is therefore an object of the invention to provide an optical semiconductor device, which solve the above-described problem.

According to the invention, the optical semiconductor device includes a semiconductor substrate having an active layer, a semiconductor mesa stripe formed on the semiconductor substrate, a dummy mesa stripe formed on the semiconductor substrate, an insulating layer formed to fill up a gap between the semiconductor mesa stripe and the dummy mesa stripe, a main electrode formed on the semiconductor mesa stripe, and an extension electrode formed on top surfaces of the insulating layer and the dummy mesa stripe. The extension electrode is connected to the main electrode.

Comparing the conventional optical semiconductor device, top surface of the device is relatively wide. Therefore, it is possible to form an upper electrode with relatively wide area. As a result, in face-down mounting, connection between the device and the mount base is improved.

Moreover, extra solder moves along the extension electrode. Therefore, it is possible to avoid an electrical short of the device.

BRIEF DESCRIPTION OF THE DRAWING

The objects and features of the invention will become more apparent from the consideration of the following detailed description taken in conjunction with the accompanying drawings in which.

DESCRIPTION OF THE PREFERRED EMBODIMENT

The First Embodiment

Figure 1:
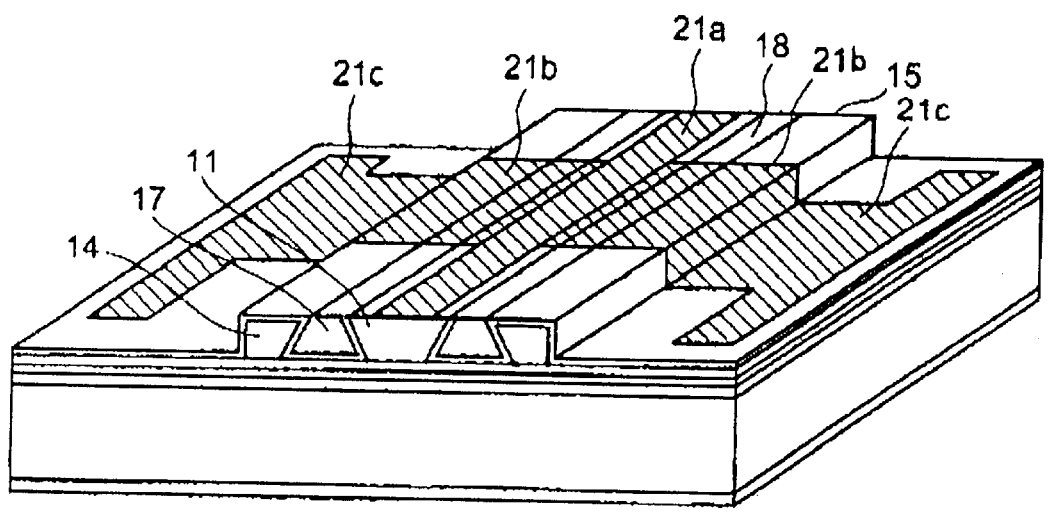
FIG. 1 is a schematic oblique view of the first embodiment according to invention.

FIG. 1 illustrates in schematic view an optical semiconductor device according to the first embodiment. As an example, the device is a mesa stripe-type (ridge waveguide-type) laser diode of 1.3 μm wavelength. FIGS. 2(a) to 2(f) illustrate a manufacturing process of the laser diode.

Figure 2:
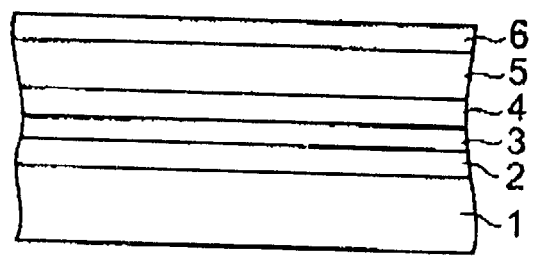
FIGS. 2(a) to 2(f) are sectional views illustrating a manufacturing process of the first embodiment.
Figure 2:
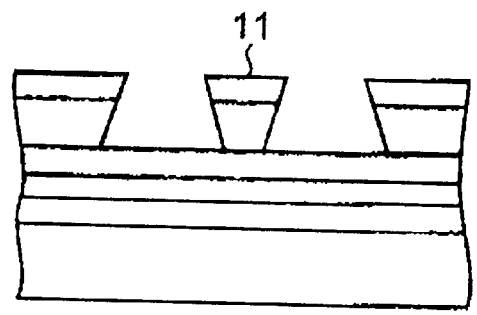
Figure 2:
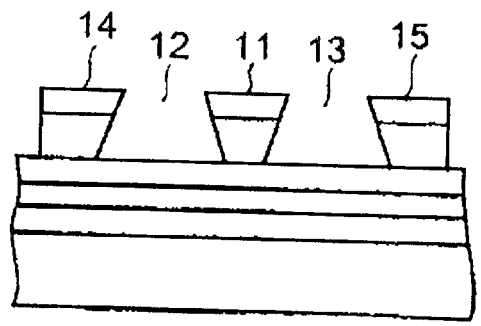
Figure 2:
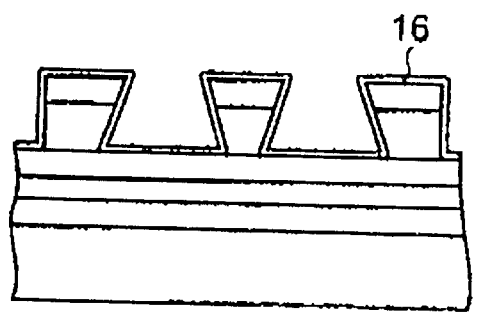
Figure 2:
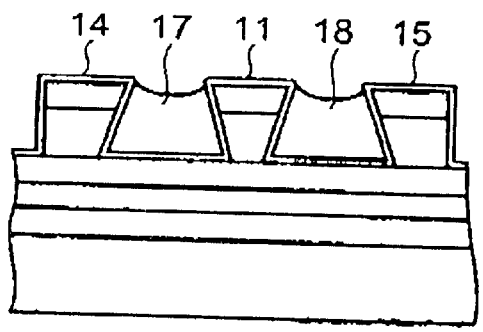
Figure 2:
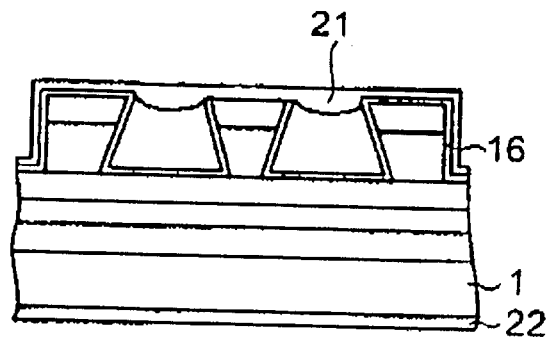

In manufacturing the laser diode, as shown in FIG. 2(a), an n-InP buffer layer 2, a GaInAlAs active layer 3, a p-InAlAs etching stop layer 4, a p-InP clad layer 5 and a p-InGaAs contact layer 6, are formed in the stated order on an n-InP substrate 1. These layers 2–6 are formed by, for example, MOVPE (metal organic vapor phase epitaxy).

Then, as shown in FIG. 2(b), using an etching mask (not illustrated), the contact layer 6 and the p-InP clad layer 5 are etched selectively by RIE (reactive ion etching). This etching stops when the etching stop layer 4 is exposed.

Consequently, the clad layer 5 is etched by conventional selective wet etching, using a mixture of hydride bromide and acetic acid as the etchant. Horizontal etching of the p-InP clad layer 5 by this etchant stops at the (111)A surface. As a result, a reverse mesa stripe 11 comprising the clad layer 5 and contact layer 6 is formed as show in FIG. 2(b). For example, width of top of the reverse mesa stripe 11 is 5 μm.

Then, as shown in FIG. 2(c), covering the mesa stripe 11 with a photo resist layer (not illustrated), dummy mesa stripes 14 and 15 are formed by RIE on both sides of the reverse mesa stripe 11. The mesa stripe 11 and the dummy mesa stripes 14, 15 are apart via grooves 12 and 13.

As shown in FIG. 2(d), an insulating layer 16 is formed on upper side of the substrate 1 including top and side surfaces of the mesa stripes 11, 14 and 15.

Then, as shown in FIG. 2(e), the grooves 12 and 13 are buried in, for example, as insulating layer 17 and 18 of insulating material such as a polyimide.

As shown in FIG. 2(f), the insulating layer 16 on top surface of the reverse mesa stripe 11 is removed. Then an upper electrode 21 including an ohmic layer and a pad layer is formed by conventional evaporation and is patterned by conventional photolithography. The substrate 1 is ground at its bottom so as to have the required thickness, for example, 100 μm. A lower electrode 22 including an ohmic layer and a pad layer is formed on the bottom surface of the substrate 1 by the evaporation.

As shown in FIG. 1, the laser diode of this embodiment has the reverse mesa stripe 11, dummy mesa stripes 14, 15 and insulating layer 17, 18 with approximately same height. Therefore, the laser diode has relatively wide area at its top surface. The upper electrode 21 comprises a stripe electrode 21a, first extension electrodes 21b and second extension electrode 21c. The first extension electrodes 21b are formed on the insulating layers 17, 18 -and dummy mesa stripes 14, 15. The second extension electrodes 21c are formed from the side surface of the dummy mesa stripes 14, 15 through adjacent lower flat areas. These electrodes 21a–21c are connected electrically.

According to the above-described structure, when the laser diode is mounted on the heat sink by the face-down mounting and the solder is melted, sure connection is obtained because of the first extension electrodes. Solder such as Sn tends to move along a metal layer and to stay on the metal layer. The extra solder moves along the first and second extension electrodes. By forming the second extension electrode largely, the solder is expected to stay on the second extension electrode. Therefore, it is possible to avoid an electric short of the laser diode.

The Second Embodiment

Figure 3:
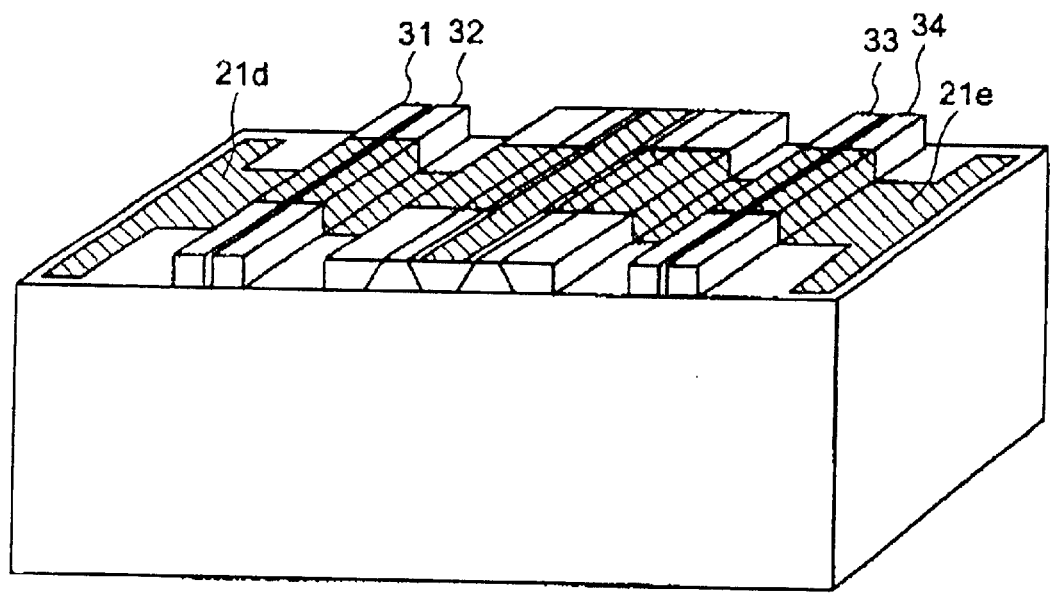
FIG. 3 is a schematic oblique view of the second embodiment.

FIG. 3 illustrates in schematic view a mesa stripe-type laser diode according to the second embodiment of the invention. In this embodiment, the laser diode has substantially the same structure as the first embodiment, and has additional dummy stripes 31–34 adjacent to the dummy stripes 17and 18.

The second extension electrodes 21c are formed across the additional dummy mesa stripes 31–34. Comparing the first embodiment, area of the second extension electrodes 21c are increased because of the side surface the solder reaches the facet of the laser diode.

Although the mesa stripe-type laser diode is described in the above embodiments, this invention is applied to other optical semiconductor device such as an optical modulator.

As described above, according to the invention, comparing the conventional optical semiconductor device, top surface of the device is relatively wide. Therefore, it is possible to form an upper electrode with relatively wide area. As a result, in face-down mounting, connection between the device and the mount base is improved.

Moreover, extra solder moves along the extension electrode. Therefore, it is possible to avoid an electrical short of the device.

What is claimed is:

1. An optical semiconductor device, comprising:
   a semiconductor substrate having an active layer;
   a semiconductor mesa stripe formed on the semiconductor substrate;
   a dummy mesa stripe formed on the semiconductor substrate;
   an insulating layer formed to fill up a gap between the semiconductor mesa stripe and the dummy mesa stripe;
   a main electrode formed on the semiconductor mesa stripe; and
   a first extension electrode formed on top surfaces of the insulating layer and the dummy mesa stripe, the first extension electrode being connected to the main electrode.

2. An optical semiconductor device according to claim 1, wherein surfaces of the dummy mesa stripe are covered with insulating film.

3. An optical semiconductor device according to claim 1, further comprising:
   a second extension electrode formed from one of side surfaces of the dummy mesa stripe through an adjacent lower flat area, the second extension electrode being connected to the first extension electrode.

4. An optical semiconductor device according to claim 3, wherein surfaces of the dummy mesa stripe and the adjacent lower flat area are covered with insulating film.

5. An optical semiconductor device, comprising:
   a semiconductor substrate;
   a buffer layer formed on the semiconductor substrate;
   an active layer formed on the lower clad layer;
   a semiconductor mesa stripe formed on the active layer, the semiconductor mesa stripe including an upper clad layer and a contact layer;
   a dummy mesa stripe formed on the active layer;
   an insulating layer formed to fill up a gap between the semiconductor mesa stripe and the dummy mesa stripe;
   a main electrode formed on the semiconductor mesa stripe; and
   a first extension electrode formed on top surfaces of the insulating layer and the dummy mesa stripe, the first extension electrode being connected to the stripe electrode.

6. An optical semiconductor device according to claim 5, wherein surfaces of the dummy mesa stripe are covered with insulating film.

7. An optical semiconductor device according to claim 5, further comprising:
   a second extension electrode formed from one of side surfaces of the dummy mesa stripe through an adjacent lower flat area, the second extension electrode being connected to the first extension electrode.

8. An optical semiconductor device according to claim 7, wherein surfaces of the dummy mesa stripe and the adjacent lower flat area are covered with insulating film.

9. An optical semiconductor device according to claim 5, further comprising:
   another semiconductor layer formed between the active layer and semiconductor mesa stripe.

* * * * *